United States Patent
Yu et al.

(10) Patent No.: US 9,665,681 B2
(45) Date of Patent: May 30, 2017

(54) METHODS AND APPARATUS FOR REPEATER COUNT REDUCTION VIA CONCURRENT GATE SIZING AND REPEATER INSERTION

(71) Applicant: Oracle International Corporation, Redwood City, CA (US)

(72) Inventors: Guo Yu, Cedar Park, TX (US); Salim Chowdhury, Austin, TX (US)

(73) Assignee: Oracle International Corporation, Redwood City, CA (US)

( * ) Notice: Subject to any disclaimer, the term of this patent is extended or adjusted under 35 U.S.C. 154(b) by 99 days.

(21) Appl. No.: 14/502,433

(22) Filed: Sep. 30, 2014

(65) Prior Publication Data
US 2016/0092626 A1    Mar. 31, 2016

(51) Int. Cl.
*G06F 17/50* (2006.01)

(52) U.S. Cl.
CPC ...... *G06F 17/5081* (2013.01); *G06F 17/5072* (2013.01)

(58) Field of Classification Search
CPC .... G06F 17/5031; G06F 2217/84; G06F 1/10; G06F 2217/62; G06F 13/4072; G06F 1/12
USPC ............................ 716/108, 113, 114, 134
See application file for complete search history.

(56) References Cited

U.S. PATENT DOCUMENTS 6,698,006 B1 *  2/2004  Srinivasan ............... G06F 1/10
                                                        716/114
8,799,843 B1 *  8/2014  Mottaez ............. G06F 17/505
                                                        716/114
8,881,089 B1 * 11/2014  Alpert ............... G06F 17/5068
                                                        716/132

OTHER PUBLICATIONS

Sze et al., Path Based Buffer insertion, 2005, ACM, pp. 509-514.*
Ratzlaff, Curtis L., et al., RICE: Rapid Interconnect Circuit Evaluation Using Awe, IEEE Trans. on Computer-Aided Design of Integrated Circuits and Systems, Jun. 1994, vol. 13, No. 6, pp. 763-776.
Alpert, Charles, J., et al., Accurate Estimation of Global Buffer Delay Within a Floorplan, ICCAD, 2004, pp. 706-711.
Hu, Shiyan, et al., Fast Algorithms for Slew Constrained Minimum Cost Buffering, IEEE Trans. on Computer-Aided Design of Integrated Circuits and Systems, Nov. 2007, vol. 26, No. 11, pp. 2009-2022.
Sze, C.N., Path-Based Buffer Insertion, IEEE Trans. on Computer-Aided Design of Integrated Circuits and Systems, Jul. 2009, vol. 26, No. 7, pp. 1346-1355.
Jiang, Zhanyuan, et al., Circuit-Wise Buffer Insertion and Gate Sizing Algorithm with Scalability, In Proc. of IEEE Design Automation Conf., Jun. 2008, pp. 708-713.
Hu, Shiyan, et al., Gate Sizing for Cell-Library-Based Designs, IEEE Trans. on Computer-Aided Design of Integrated Circuits and Systems, Jun. 2009, vol. 28, No. 6, pp. 818-825.

(Continued)

*Primary Examiner* — Nghia Doan
(74) *Attorney, Agent, or Firm* — Brooks Kushman P.C.

(57) ABSTRACT

Techniques for circuit concurrent gate sizing and repeater insertion considering the issue of size conflicts are described herein. Certain of these techniques can be directed to coupled gates within levels of a levelized circuit falling within a coupling window defined by a minimum slack gate and adjacent gates coupled to the minimum slack gate with an adjacency parameter less than a predefined adjacency limit.

20 Claims, 5 Drawing Sheets

(56) References Cited

OTHER PUBLICATIONS

Chen, Wei, et al., Simultaneous Gate Sizing and Placement, IEEE Trans. on Computer-Aided Design of Integrated Circuits and Systems, Mar. 2000, vol. 19, No. 2, pp. 437-447.

Cong, Jason, et al., Simultaneous Buffer and Wire Sizing for Performance and Power Optimization, In Proc. of IEEE International Symposium on Low Power Electronics and Design, 1996, pp. 271-276.

Jiang, Yanbin, et al., Interleaving Buffer Insertion and Transistor Sizing Into a Single Optimization, IEEE Trans. on Very Large Scale Integration, 1998, vol. 6, No. 4, pp. 625-633.

Alpert, Charles, et al., Simultaneous Driver Sizing and Buffer Insertion Using a Delay Penalty Estimation Technique, IEEE Trans. on Computer-Aided Design of Integrated Circuits and Systems, Jan. 2004, vol. 23, No. 1, pp. 136-141.

Van Ginneken, Lucas, P.P.P., Buffer Placement in Distributed RC-Tree Networks for Minimal Elmore Delay, In Proc. of IEEE International Symposium on Circuits and Systems, 1990, pp. 865-868.

Lillis, John, et al., Optimal Wire Sizing and Buffer Insertion for Low Power and a Generalized Delay Model, IEEE J. of Solid-State Circuits, Mar. 1996, vol. 31, No. 3, pp. 437-447.

Shi, Weiping, et al., A Fast Algorithm for Optimal Buffer Insertion, IEEE Trans. on Computer-Aided Design of Integrated Circuits and Systems, Jun. 2005, vol. 24, No. 6, pp. 879-891.

Li, Zhuo, et al., An O(bn2) Time Algorithm for Optimal Buffer Insertion with b Buffer Types, IEEE Trans. on Computer-Aided Design of Integrated Circuits and Systems, Mar. 2006, vol. 25, No. 3, pp. 484-489.

Alpert, Charles J., Buffer Insertion with Accurate Gate and Interconnect Delay Computation, In Proc. of IEEE Design Automation Conf., 1999, pp. 479-484.

Liu, I-Min, et al., Meeting Delay Constraints in DSM by Minimal Repeater Insertion, In Proc. of Design, Automation, and Test in Europe Conf., 2000, pp. 436-440.

Chen, Ruiming, et al., An Effective Algorithm for Buffer Insertion in General Circuits Based on Network Flow, IEEE Trans. on Computer-Aided Design of Integrated Circuits and Systems, Nov. 2007, vol. 26, No. 11, pp. 2069-2073.

Hu, Shiyan, et al., A Fully Polynomial Time Approximation Scheme for Timing Driven Minimum Cost Buffer Insertion, In Proc. of IEEE Design Automation Conf., Jul. 2009, pp. 424-429.

Liu, Yifang, et al., A New Algorithm for Simultaneous Gate Sizing and Threshold Voltage Assignment, IEEE Trans. on Computer-Aided Design of Integrated Circuits and Systems, Feb. 2010, vol. 29, No. 2, pp. 223-234.

Chen, Chung-Ping, et al., Fast and Exact Simultaneous Gate and Wire Sizing by Lagrangian Relaxation, IEEE Trans. on Computer-Aided Design of Integrated Circuits and Systems, Jul. 1999, vol. 18, No. 7, pp. 1014-1025.

Wang, Jia, et al., Gate Sizing by Lagrangian Relaxation Revisited, IEEE Trans. on Computer-Aided Design of Integrated Circuits and Systems, Jul. 2009, vol. 28, No. 7, pp. 1071-1084.

Wu, Tai-Hsuan, et al., PaRS: Parallel and Near-Optimal Grid-Based Cell Sizing for Library-Based Design, IEEE Trans. on Computer-Aided Design of Integrated Circuits and Systems, Nov. 2009, vol. 28, No. 11, pp. 1666-1678.

* cited by examiner

METHODS AND APPARATUS FOR REPEATER COUNT REDUCTION VIA CONCURRENT GATE SIZING AND REPEATER INSERTION

TECHNICAL FIELD

This disclosure relates to circuit gate sizing and repeater insertion.

BACKGROUND

Gate sizing and repeater insertion are two effective methods in the physical design stage for timing closure and power reduction. Even though gate sizes and repeater solutions impact each other, the two methods are traditionally applied sequentially leading to sub-optimal timing/power. Some previous works on simultaneous repeater insertion and gate sizing consider only a single net, sizing its driver in association with repeater insertion in the net. Other previous works consider multiple nets, but fail to consider the conflicts in size requirements in optimizing a multitude of interacting timing paths.

SUMMARY

A method for circuit concurrent gate sizing and repeater insertion includes assigning each gate of a circuit into one of a plurality of levels based on logical connections of the gates excluding repeaters. The method further includes, for each of the levels, identifying coupled gates associated with a minimum slack gate based on an adjacency parameter, generating repeater insertion solutions at each output of the coupled gates, assigning to each of the coupled gates a minimum size based on a maximum slew limit, propagating the repeater insertion solutions at each of the outputs to corresponding inputs, selecting, for each of the outputs of the minimum slack gate, a minimum cost repeater insertion solution from the repeater insertion solutions, increasing a size of the minimum slack gate, and selecting, for each of the outputs of the minimum slack gate, an updated minimum cost repeater insertion solution from the repeater insertion solutions.

A system for circuit concurrent gate sizing and repeater insertion includes at least one processor programmed to, for coupled gates within a level of a levelized circuit falling within a coupling window defined by a minimum slack gate and adjacent gates coupled to the minimum slack gate with an adjacency parameter less than a predefined adjacency limit, a) assign to each of the coupled gates a minimum size based on a maximum slew limit, b) propagate repeater insertion solutions at each output of the coupled gates to corresponding inputs, c) select, for each of the outputs of the minimum slack gate, a minimum cost repeater insertion solution from the repeater insertion solutions, d) increase a size of the minimum slack gate, e) select, for each of the outputs of the minimum slack gate, an updated minimum cost repeater insertion solution from the repeater insertion solutions, and f) iteratively perform d) and e) until accepting or rejecting the size of the minimum slack gate based on the updated minimum cost repeater insertion solutions.

A computer readable medium has instructions stored thereon that, when executed by a processor, cause the processor to perform operations of, for coupled gates within a level of a levelized circuit falling within a coupling window defined by a minimum slack gate and adjacent gates coupled to the minimum slack gate with an adjacency parameter less than a predefined adjacency limit, a) assigning to each of the coupled gates a minimum size based on a maximum slew limit, b) propagating repeater insertion solutions at each output of the coupled gates to corresponding inputs, c) selecting, for each of the outputs of the minimum slack gate, a minimum cost repeater insertion solution from the repeater insertion solutions, d) increasing a size of the minimum slack gate, and e) selecting, for each of the outputs of the minimum slack gate, an updated minimum cost repeater insertion solution from the repeater insertion solutions.

DETAILED DESCRIPTION

Figure 1:
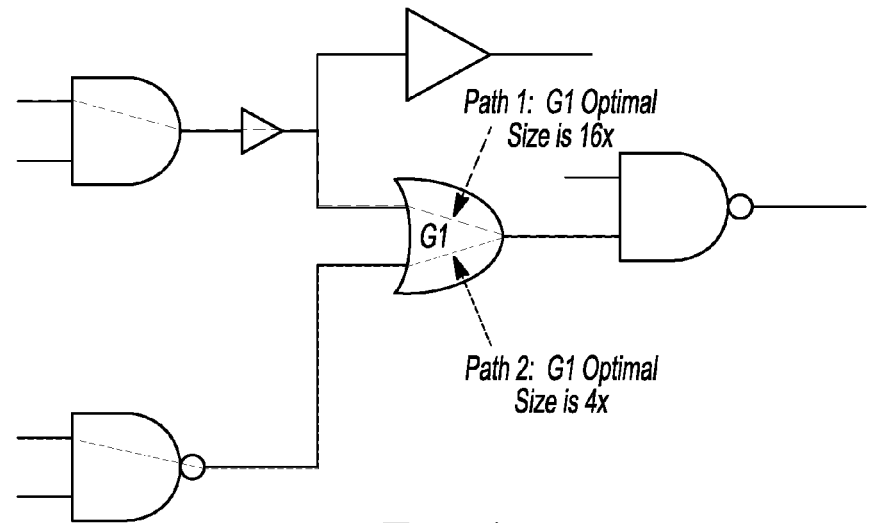
FIG. 1 is a schematic diagram of a circuit illustrating several timing paths.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

New algorithms are proposed to perform gate sizing and repeater insertion concurrently considering timing criticalities and gate size conflicts among timing paths. The proposed concurrent techniques enable considerable reductions in both repeater count and power. Repeater count reduction is helpful in modern complex ASICs and microprocessor chip designs to alleviate post repeater routing related issues. A number of new ideas are used in this document to extend the traditional bottom-up dynamic algorithm. These extensions deal with (i) identifying a group of fan-out gates (nets) and a group of fan-in gates (nets) which are coupled together due to the interaction of a multitude of logic paths; (ii) defining a multi-source optimization objective that captures both sizing of the coupled gates and repeater insertion in the coupled nets; and (iii) run time control via early detection of local-solution convergence. Several enhancements of the traditional repeater insertion algorithm have also been proposed to reduce memory usage and improve run time. The experimental results on a set of large industrial circuits demonstrate that, for similar timing performance, the repeater count can be reduced to more than 40% and the accumulated sizes of the gates being resized can be reduced by more than 50%.

I. INTRODUCTION

Among the many physical design optimization methods, repeater insertion and gate sizing may be the two most effective approaches for timing closure and power optimization. The classical repeater insertion method for optimal timing slacks for a single net is the dynamic programming (DP) algorithm proposed over twenty years ago. Since then it has been extended by many to handle issues such as power, slew and noise. Certain techniques, for example, considered cost for discrete repeater types and trading-off timing slack with power in an algorithm of time complexity $O(|b|^2 n^2)$, where $|b|$ is the number of available repeater types and n is the number of candidate locations. Other techniques further improved the runtime complexity (assuming Elmore delay model) to $O(|b|^2 n \log^2 n)$ and $O(|b| \ln^2)$. Higher order delay/slew models have also been adopted for better timing accuracy. Other than the DP algorithm, a Lagrangian relaxation method, a network flow method, and polynomial time approximation scheme (in the worst case) have all been proposed.

Gate sizing is another technique to improve design timing and power. Noticeable previous works on gate sizing include the Lagrangian Relaxation method, randomized algorithm, and continuous-discretized algorithm. Gate sizing can also be applied when solving other problems, like Vt (threshold voltage) assignment, placement, and wire sizing.

Although most previous works focus on either gate sizing or repeater insertion as independent problems, a few researchers have noticed that better design quality can be achieved by considering gate sizing and repeater insertion at the same time. Some, for example, have proposed using delay sensitivities to make decisions on how to insert repeaters or size gates. Others have used driver delay and area penalty to select driver size when inserting repeaters for a single net.

Certain previous techniques group and process nets and gate arcs in the same timing path. These nets and gate arcs are merged as a new single pseudo net such that van Ginneken's algorithm can be applied on the pseudo net. This algorithm was improved by using dynamic sink selection and circuit partition. Other previous techniques consider interactions between repeater insertions and gate sizing, and have a view of timing for the updated circuit. As a result, it is not surprising to observe significant repeater cost reduction when compared to the results of net-by-net repeater insertion.

Path-based methods, however, do not address several issues. First, ordering of path processing is not defined. Naturally, the most critical path should be processed first, but the criticality would change dynamically when buffers are inserted or gate sizes are changed. Such information has not previously been taken into consideration, and as such, the path-ordering problem is not dealt with. Second, for gates having more than one input or output, the optimal gate sizes in one path probably would not be the optimal gate sizes for other paths. The gate sizes will be modified when processing a new timing path, so the gate-sizing algorithm may oscillate or fail to converge to an optimal size. These problems are illustrated in FIG. 1 in which gate G1 belongs to both path 1 and path 2. For path 1, the optimal size of G1 is 16× but for path 2, the optimal size is 4×. Also depending on the gate size of G1, the criticality of path 1 and path 2 could change. If the paths are considered separately, the conflicting sizes for G1 would result in non-convergence of the gate sizing and repeater insertion algorithm.

In high-performance circuit designs in which many paths with similar timing margins pass through a common gate, different sizes of the gate could make different paths critical. Most of the time, the optimal gate size for one timing path is sub-optimal for a different timing path, as illustrated in FIG. 1. Optimizing these paths is interdependent. Sub-optimal gate sizes may also result in inferior repeater solutions in the nets connected to them. There does not appear to be a viable approach to gracefully solve the problems of gate size conflicts in coupled timing paths. In some previous techniques, such conflicts are avoided altogether and resolved in a post-processing step by brute-force. Here, this problem is solved by proposing algorithms to perform timing and circuit topology aware gate sizing and repeater insertion concurrently. The proposed algorithms are able to solve the gate size conflicts between coupled timing paths without much runtime overhead. That is, techniques described herein address the conflicts of gate sizing coupled timing paths in concurrent gate sizing and repeater insertion using a dynamic programming approach.

All gates and nets are grouped and processed based on connectivity. The gates sharing the same driving nets are grouped as coupled gates. These groups of gates are levelized from primary input (PI) to primary output (PO) and processed in the reverse order. A distance measure is defined for two gates in a group of coupled gates. To employ a trade-off between solution quality and run time, the optimization algorithm uses a pre-defined maximum distance to couple gates. DP style algorithms to propagate repeater solutions from the output pins to the input pins for multi-input and multi-output gates are also presented. These methods retain all non-suboptimal repeater solutions in the coupled nets while removing inferior ones. The concept of "coupled pruning" is used to prune sub-optimal solutions at multiple inputs of a single gate.

II. PROBLEM FORMULATION

A digital circuit can be modeled as a directed acyclic graph (DAG): G=(V, E), where V stands for a set of nodes and E stands for a set of edges. The nodes include a set of primary input (PI) ports and a set of primary output (PO) ports, input and output pins for gates, and pre-assigned candidate repeater locations in the interconnect networks (nets). The edges consist of interconnect networks (wires) and timing arcs within the gates.

The nonlinearities caused by the continuous technology scaling have rendered simple R/C models of wires and simplistic timing models (such as the Elmore model) inadequate in the state-of-the-art VLSI technologies. The DP algorithm is independent of R/C and timing models and lends itself to accurate high order interconnect models. Practical design constraints have been taken into consideration and include (i) placement blockages for inserting repeaters in free spaces outside these blockages, (ii) availability of sufficient free spaces for gate sizing, (iii) the impact of signal slew (transition) rates on interconnect and gate delays, (iv) noise and power to help with signal integrity, and (v) maximum and minimum allowable slew rates for gates and nets. Note that Vt assignment is similar to gate sizing and can be considered with gate sizing without much algorithm change.

The problem of concurrent gate sizing and repeater insertion considering sizing conflicts is defined as follows. Given a DAG which represents a placed and routed circuit, possible candidate repeater locations, and a repeater and gate library, obtain a global repeater and gate sizing solution such that the total cost of repeater and gates are minimized, physical constraints (for example no overlaps among block, gate and repeater locations) and slew rates are met, and the required arrival time at each PI port is met as best as possible. The optimization targets can be defined as a weighted sum of cost associated with timing violations added to the penalties due to gate area/power and repeater area/power.

$$\text{minimize } \Sigma\text{cost\_violations} + \Sigma\text{cost\_gate} + \Sigma\text{cost\_repeaters} \qquad (1)$$

III. CONCURRENT GATE SIZING AND REPEATER INSERTION ALGORITHMS

In this section, the algorithms for the concurrent gate sizing and repeater insertion considering the issue of size conflicts are presented. The overall optimization flow is first briefly described. Then, ideas including the concepts of "levelization" and "coupled gates," algorithms for propagation and pruning of partial solutions for multi-input/output gates, determining gate sizes, and repeater solutions and timing propagation are addressed.

The whole circuit is divided into several levels based on logical connections. In this leveling scheme, if the gate x is driving the gate y, then the gate y has a higher level than that of x. Processing order goes from higher-level gates toward the lower-level gates. For gates within the same processing level, processing is started from the most timing-critical gate and associated nets. To determine the timing criticality of nets, a post-repeater-only (without gate sizing) static timing is relied on. Within the same level, the gates which are coupled are identified (discussed below). Identification of coupled gates assists with effectively resolving gate size conflicts. The processing sequence of gates within a coupled group is based on dynamically adjusted timing criticality. Thus, the timing path criticality and gate size conflicts caused by different timing paths are considered at the same time.

To extend the van Ginneken algorithm from inserting repeaters only in a net to both inserting repeaters and sizing drivers/gates, an algorithm is proposed to propagate and prune repeater solutions from gate output pins to the input pins. The best repeater solutions are determined using a cost function including repeater cost, gate cost, and timing violation reduction. This cost function is also used to determine if the best gate sizes and repeater solutions are found. To cover the whole range of gate sizes, the starting size for each gate is set to the lowest slew-feasible size.

Figure 2:
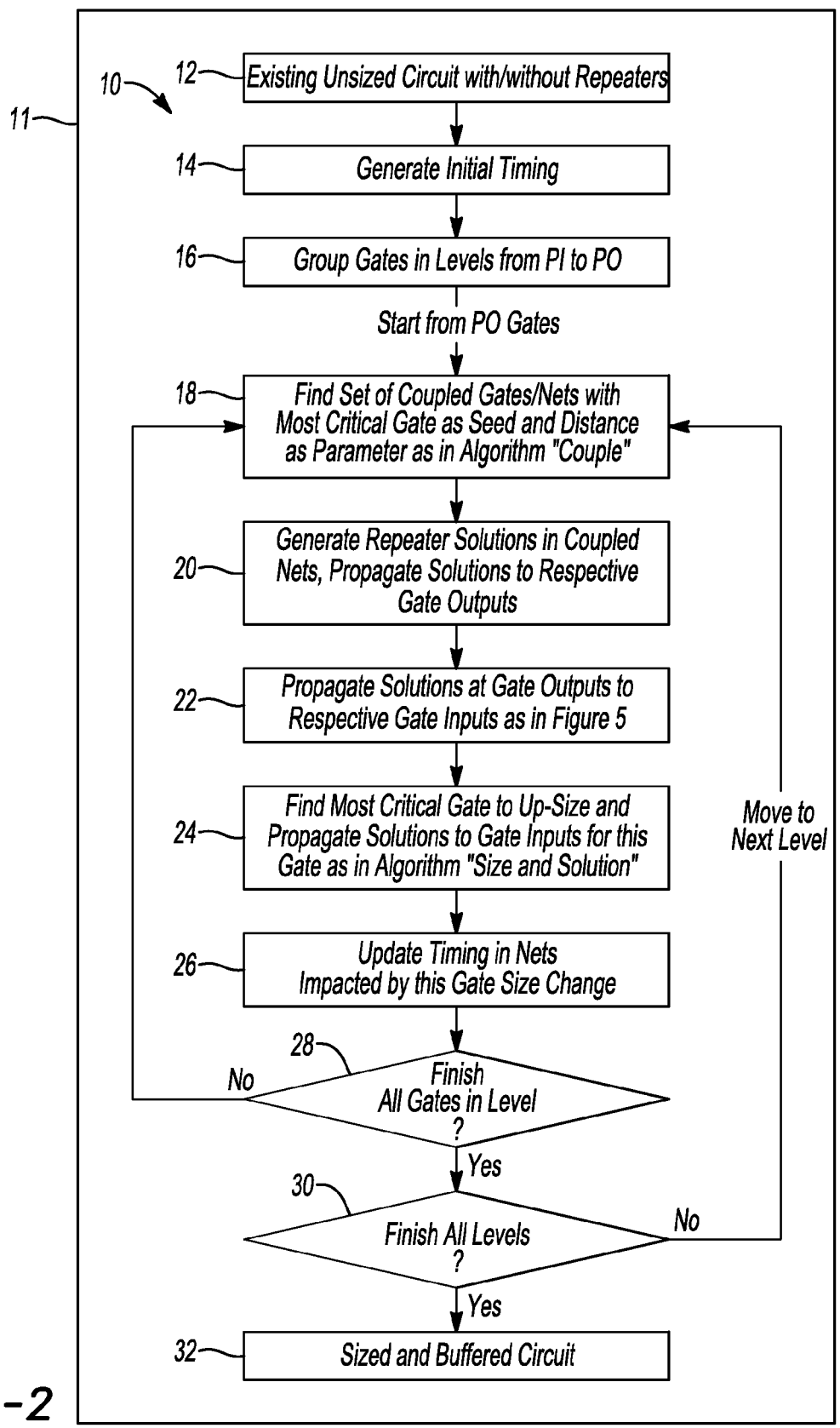
FIG. 2 is a flow chart depicting an algorithm for gate sizing and repeater insertion.

A proposed algorithm 10, which can be executed by one or more processors 11, is illustrated in FIG. 2. Beginning with an un-buffered/buffered and un-sized (in terms of gates) design at operation 12, initial timing is generated at operation 14 and the circuit is levelized at operation 16 working from primary inputs to primary outputs. Starting with the maximum level, the most timing critical gate is identified and its coupled gates (defined below) are found at operation 18. Old repeater solutions (if any) for the net connected to the output pins of the coupled gates are deleted. New repeater solutions for the nets connected to the output pins of the coupled gates are generated and propagated to the respective gate outputs at operation 20. At operation 22, net repeater solutions are propagated to the gate input pins. The timing critical gate, at operation 24, is then (tentatively) up-sized one or more steps, and the repeater solutions based on the current gate size are propagated from the gate outputs to the gate inputs. At operation 26, the timing map is updated for the impacted nets, changes in the violations are computed, and a new cost is computed. The tentative up-sizing is accepted or rejected based on the new cost. If all gates at the current level are not processed then the new most critical gate is identified. These steps continue until the best cost or the highest gate sizes are reached for the gates in the current level. At decision block 28, the algorithm 10 passes to decision block 30 if all gates in the same level have been processed. The algorithm 10 returns to operation 18 if all gates have not been processed. At decision block 30 if all levels have been processed, the algorithm 10 ends at operation 32 with a sized and buffered circuit. If not, the algorithm 10 moves to the next level and returns to operation 18. That is, the algorithm 10 moves level by level until the gates and nets in all levels are sized/buffered.

Initial Timing Estimation

Accurate timing estimation may help guide gate sizing and repeater insertion. Such timing can be generated using a simple van Ginneken style repeater insertion followed by a static timing run. Repeaters are inserted in single nets following the van Ginneken algorithm with slew constraints. A sign-off static timing analyzer (STA) can then be applied on the buffered design to determine arrival times and timing slacks (negative slack indicates timing violations) at gate input and output nodes. (Techniques described herein use required arrival time (RAT) propagated from primary outputs to calculate gate criticality and timing violation. The RAT (denoted as q) for a node is simply the arrival time plus the slack at the node.)

The gate criticality is used to determine the order of processing within a level. The most timing critical gate will be processed first. The timing criticality changes dynamically during sizing. As such, RAT values should be propagated through nets and gates accurately. The timing violation calculated for each gate is used to determine gate sizes and repeater solutions. Certain timing violation margins (depending on the processing level) are used, which will be explained in the next sections.

Levelization

Figure 7:
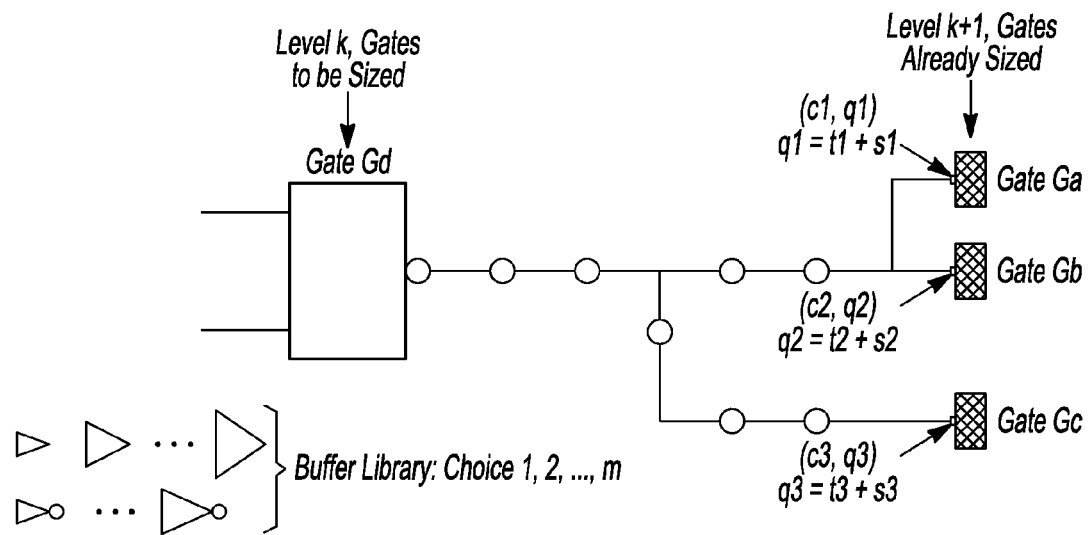
FIGS. 7 through 9 are schematic diagrams of circuits illustrating candidate locations.

For processing level-by-level, the sub-optimal solutions are identified and pruned at a given processing level while the non-sub-optimal solutions are propagated to the next processing level. A solution involves a choice. For a gate, this choice is in terms of the size of the gate. For repeater insertion, this choice is in terms of the size of the repeater being inserted (zero-size encodes the decision of not inserting a repeater at a location). For example, FIG. 7 shows generating a repeater insertion solution using repeater sizes in a given repeater library in predetermined candidate locations. The gates in level (k+1) are already sized. The q-values shown at the input of these gates are already computed. The c-values are determined from the size of the gates. In case these gates are terminal gates of the circuit, q-values are determined from the arrival times (t1, t2, t3, etc.) and corresponding slack values.

Figure 3:
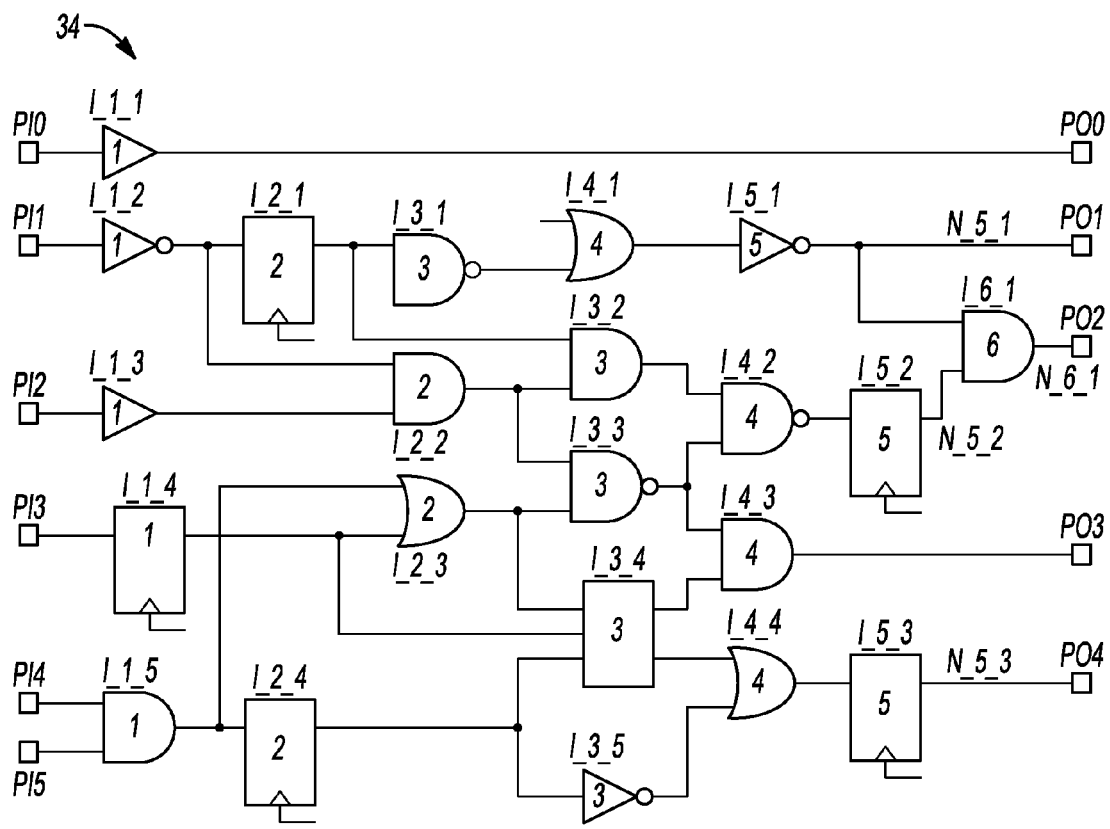
FIG. 3 is a schematic diagram of a levelized circuit.

As illustrated in FIG. 3, a topological sorting or "levelization" from the power inputs (PIs) to the power outputs (POs) of DAG 34 using a depth first search (DFS) algorithm is performed. The gates will be marked with level numbers (in this example, 1, 2, 3, 4, 5 and 6). The nets connected to the gate output pins will have the same level number as the driver. Then the gates and nets are processed backward from the POs to the PIs. Since the DAG 34 is sorted using DFS and processing is performed backward, the sinks of the gates and nets in that level are already processed when processing a certain level.

Coupling Window

Figure 4:
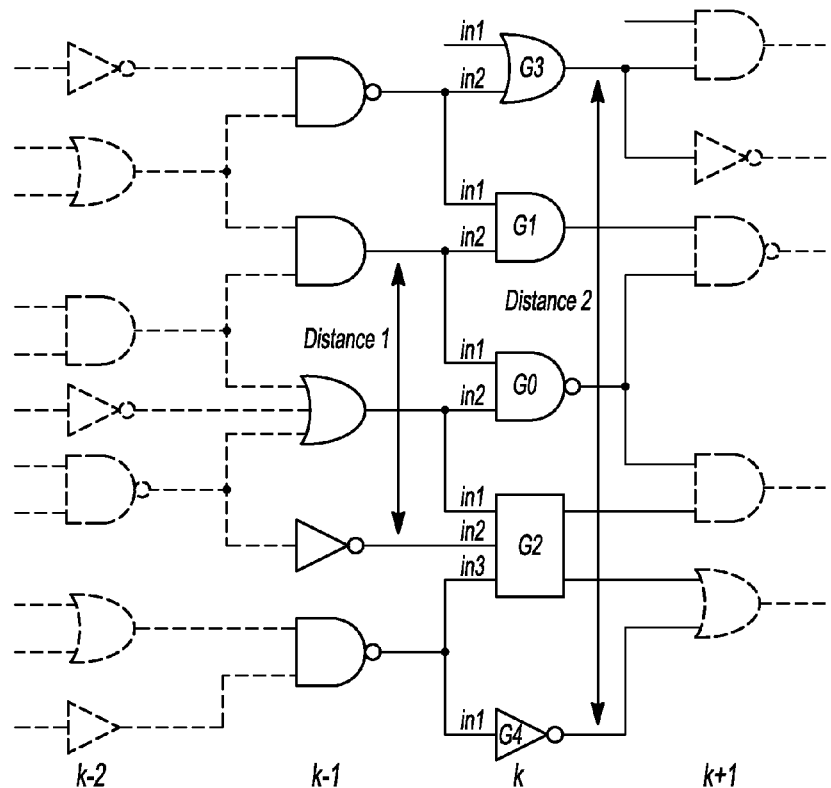
FIG. 4 is a schematic diagram of a circuit illustrating coupling windows defined by different adjacency parameters.

The number of gates and nets within a process level could be prohibitively large in large circuit designs. In this section, the concept of "coupling window" is proposed to further reduce the problem of complexity. A multi-input gate G at a given processing level may be linked to other gates at the same processing level via a common net connected to the input. For example, gate G0 in FIG. 4 is linked to gate G1 and G2 via common nets at the input side. Thus, sizing of gate G0 impacts sizing of G1 and G2 and vice versa. Gates G0, G1 and G2 thus belong to a coupled window (with a distance or adjacency of 1). Extending the concept recursively, gates G0, G1, G2, G3 and G4 belong to a coupled window (with a distance or adjacency of 2). Allowing a large distance to define the coupling window may make the number of gates in a window too large. The maximum distance (adjacency) allowed may be restricted when defining a coupling window. Experiments have shown that using a distance of 5, for example, is sufficient to maintain the solution optimality while keeping the runtime low.

Pseudo code to find coupled gates within a predefined coupling distance W is shown in the algorithm "couple" below. During the processing, all gates and nets within a processing level will be partitioned into several groups based on the coupling window. The groups of gates and nets will be processed in the order of timing criticality.

1. Start at instance i with distance d=0 and the set of coupled gates G={i}
2. Insert inputs of instances in G in set J
3. For each input pin j∈J, find instances K (in the same level) but not in G connected to pin j via a common net
4. If K={ } return G and stop
5. d=d+1
6. G=G+K; if d=W return G and stop
7. Go to step 2

Propagation and Pruning of Solutions for Multi-Input/Output Gates

Figure 5:
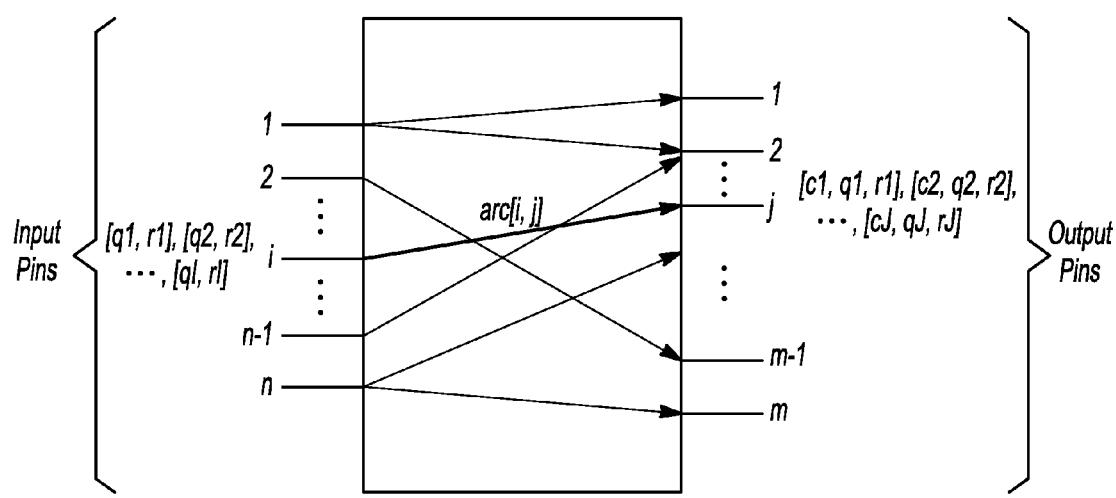
FIG. 5 is a schematic diagram of a multi-input/multi-output gate.

Assuming an n-input and m-output gate 36 as shown in FIG. 5, different input pins of the gate 36 could be in different timing paths and would have various timing requirements—yet all belong to the same gate. For the timing path through pin 1, the maximum gate size could be required to reduce cell delay. For the timing path through pin n, the minimum gate size may be optimal since it can reduce net load capacitance. These conflicts of gate sizes require one to consider all gate outputs and inputs together.

Repeater insertion is first processed in the m nets connected to the output pins of gate 36. Assume the solutions [c1, q1, r1], [c2, q2, r2], . . . , [cJ, qJ, rJ] are generated at the j-th output pin. Here, c is the capacitance, q is the required arrival time, r is the cost, and J is the number of solutions at the j-th output. Without loss of generality, how to propagate these solutions to the input i via the timing arc[i,j] will be discussed. Since the capacitance is the same for the same input pin, the solutions in the input pins only have required arrival time q and cost r. Slew-infeasible solutions are discarded. For the solution at the net driven by the j-th output pin, if any of its solutions generated in the input pins fails to meet the slew requirement, this solution and its solutions at the input pins will be pruned.

Additional solution pruning occurs to remove solutions with sub-optimal timing (RAT) and solution cost (repeater cost). For the same gate input pin, the best RAT is determined by the worst of the best RATs propagated from different gate output pins. For example, if input pin 1 has timing arcs to output pins 1 and 2 as shown in FIG. 5, and the propagated RATs from the output pin 1 have values of 2.3 and 2.5, the propagated RATs from pin 2 have values of 2.4, 2.6 and 2.8. The best achievable RAT at the input pin i is the min{max(2.3, 2.5), max(2.4, 2.6, 2.8)}, which comes out as 2.5.

As mentioned above, certain repeater solutions propagated at the input pins will be pruned due to sub-optimality (both timing and cost are sub-optimal). Note that since one repeater solution at a gate output pin will generate one solution in each input pin, these solutions can only be pruned if the RAT and repeater cost are both suboptimal in all input pins. In practice, it has been observed that in most cases the sub-optimality is consistent for all input pins, which means that if the solution generated in one input pin is suboptimal, it has a very good chance to be suboptimal at other input pins as well. All non-suboptimal solutions at the inputs are retained.

Determining Gate Size and Repeater Solution

After the propagation and pruning of solutions from a gate's output pins to input pins, multiple non-suboptimal solutions at the input pins may be present. These solutions either have better timing or smaller repeater cost. Theoretically, all these solutions should be propagated to the PIs so global optimality can be achieved. If, however, all these solutions are so propagated, the number of non-suboptimal solutions would increase exponentially, and the computation cost of generating and propagating these solutions would be prohibitive. As a result, the optimal choice of gate sizes and repeater solutions for the instances within a level are fixed before processing the gates in the next level.

The algorithm to determine gate sizes and repeater solutions ("algorithm size and solution") is discussed further below. Since the pruning step during the solution propagation has already eliminated sub-optimal solutions, the remaining solutions are either better at timing or better at repeater cost. When gate sizes are considered, gate cost (area and power) will also affect the total design cost. In order to compare each combination of gate size and repeater solution, a cost function is used that is defined as $$\text{cost} = t\Sigma_{i=1}^{\text{\# of nodes}} \text{vio}_i' + b\Sigma_{j=1}^{\text{\# of repeaters}} \text{rep\_cost}_j + g\Sigma_{k=1}^{\text{\# of couple gates}} \text{gate\_cost}_k \quad (2)$$

where t is the weighting factor for vio' (modified timing violation), b is the weighting factor of the repeater cost, and g is the weighting factor of the gate cost. The modified timing violation is further defined as $$\text{vio}_i' = \begin{cases} u \cdot \text{vio}_i + (1-u) \cdot \text{vio}_{th} + |\text{slack}_{margin}| & \text{if } (\text{vio}_i > \text{vio}_{th}), u > 1 \\ \text{vio}_i + |\text{slack}_{margin}| & \text{if } (\text{slack}_{margin} < \text{vio}_i < \text{vio}_{th}) \\ 0 & \text{if } (\text{vio}_i < \text{slack}_{margin}), \text{slack}_{margin} < 0 \end{cases} \quad (3)$$

The consideration in the modified timing violation is that, if the timing violation is larger than a pre-defined threshold (>$\text{vio}_{th}$), the focus should be on optimizing the timing, so a weighting factor (u) is added on the timing violation. If the timing violation is negative (has positive timing slack) and smaller than a pre-defined slack margin, the effective violation is set to 0 since it will not help overall circuit timing. For the timing violation between $\text{slack}_{margin}$ and $vio_{th}$, the effective violation is assigned as the actual timing violation. It is interesting to note that the above definition of vio preserves continuity of values in different ranges.

Figure 6:
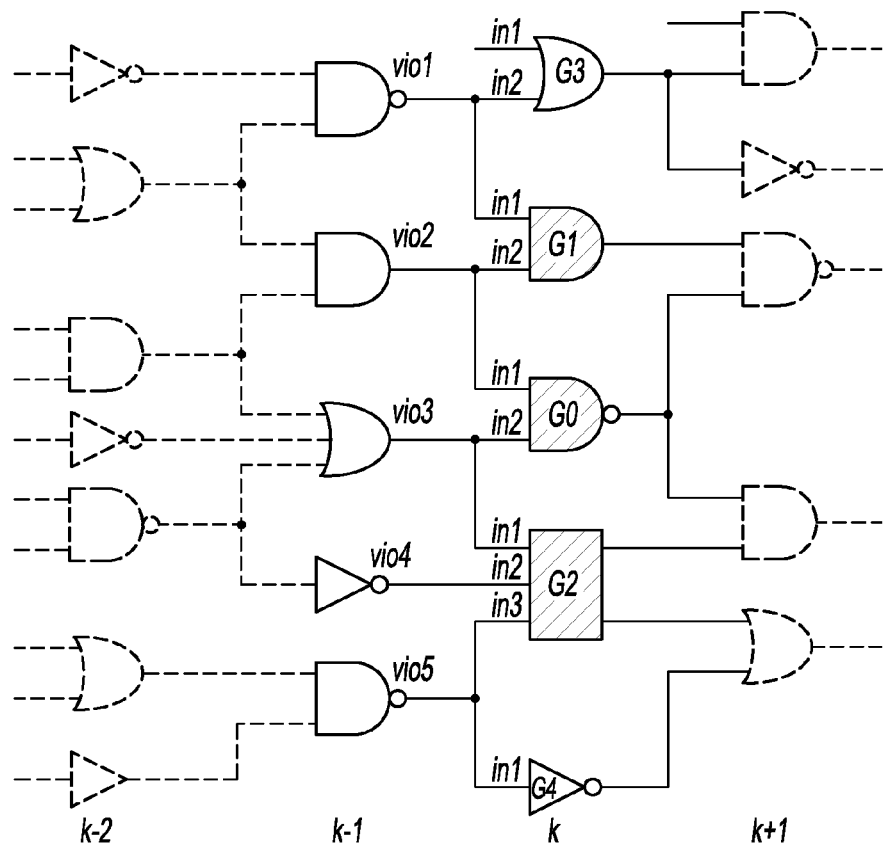
FIG. 6 is a schematic diagram of a circuit illustrating timing violations associated therewith.

The violations are defined at the driver output pins connected to the gates under optimization. Since the sizes of the gates to size would affect the loading of drivers at a preceding level, and change the overall circuit timing, the preceding level driver's output pin timing violations are used to better represent the timing situation. FIG. 6 illustrates the definition of the timing violations. Suppose that the coupled instance group contains G0, G1 and G2, the timing violations are then vio1 to vio5.

Determining Lowest Slew Feasible Size for a Gate

The gate sizes for all drivers are set to the lowest slew feasible sizes as the starting sizes for the gate sizing procedure.

1. Set size of gate to lowest available size
2. Compute and propagate solutions from all gate output pins to input pins, following gate timing arcs
3. If every input pin has at least one feasible solution, use current size as lowest slew feasible size
4. Else, increase gate size to next larger size and go to step 2

During the gate size exploration for optimization, all non-suboptimal repeater solutions at gate output pins are kept, and the solution-combinations at the input pins with the best cost are selected because the optimality of repeater solutions at a gate's output pins would change for different gate sizes. The algorithm "size and solution" is given below:

1. Set size of each gate within coupled window to lowest slew feasible size
2. For each (input) net in coupled window, select repeater solution with best cost at input side of drive gate and calculate total cost (cost_init)
3. cost_best=cost_init
4. Find gate in coupled window with worst timing violation, size S=next available bigger size
5. For the new size S, calculate total cost (cost_i) to include repeater cost, gate cost, and violation cost
6. If (cost_i<cost_best), assign size S to gate and assign cost_best=cost_i, set opt_check_count=0
7. Else, opt_check_count++, S=next available bigger size
8. If (opt_check_count>opt_check_max) or all gates are at max sizes, stop
9. Go to step 4

Figure 8:
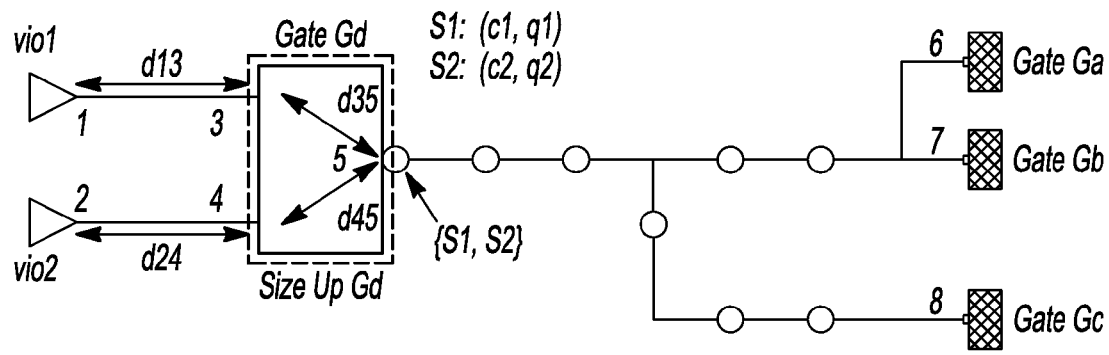

As an example of computing violations and cost, consider the circuit in FIG. 8. For non-suboptimal solutions S1 at the output of the gate, q1=min(q6-d561, q7-d571, q8-d581), where d561 is the delay value between nodes 5 and 6 for solution S1. For solution S2, q2 is computed similarly. The value of c1 for S1 (or c2 for S2) is determined by the corresponding downstream gate/repeater capacitance and interconnect capacitance. In propagating q-values from the gate output to the inputs, we compute d351 and d451 (for solution S1) and d352 and d452 (for solution S2). Finally, the q-values at nodes 1 and 2 are computed using q-values at nodes 3 and 4, respectively, and the interconnect delay values d13 and d24, respectively. Also note that q1=q3-d13, q2=q4-d24, and vio1=t1 (arrival time at node 1)-q1. (voi2 is similarly defined).

Figure 9:
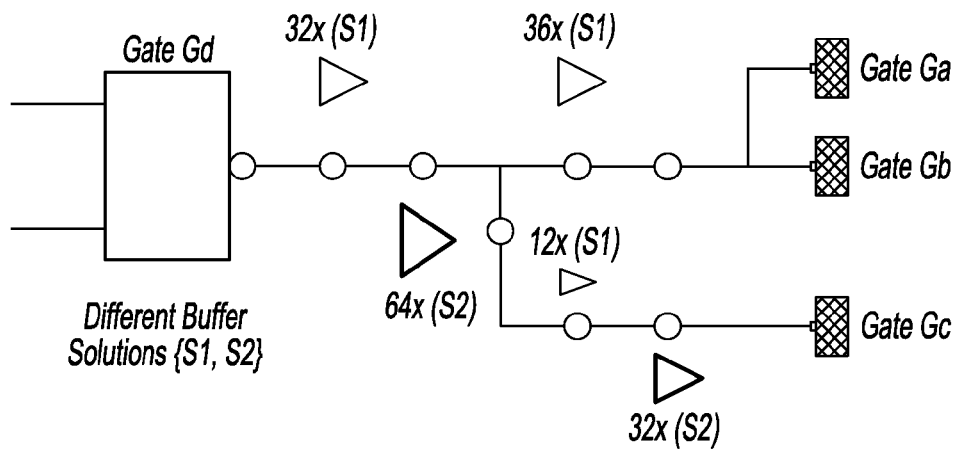

As another example of computing violations and cost, consider the circuit in FIG. 9. There are two solutions S1 and S2 computed at the output of gate $G_d$. Depending on the size of the gate Gd, either S1 or S2 can be selected as the optimum repeater solution. Note that, the repeater count as well as the repeater sizes are different for solutions S1 and S2.

In the algorithm above, a variable opt_check_max is set, which is the maximum steps to continue searching if the new gate sizes and repeater solution combination does not improve cost. Timing versus gate size has been observed to be non-convex. The variable opt_check_max is used here to avoid the search getting stuck at a local optimal point. It is recommended to set opt_max_check at greater than 5.

Finally, the circuit in FIG. 3 can be used to illustrate the sequence of processing nets and gates. First, repeaters are inserted for net N_6_1, which is driven by gate I_6_1 in the last stage. Then, solutions are propagated to the input pins of I_6_1. The gate size with the lowest cost is calculated by Equation 3. After determining the size for I_6_1, level 5 (in which there are three gates I_5_1, I_5_2, and I_5_3) is examined. Suppose it is found that gate I_5_2 has the worst timing violation in its input pins. Since there is no coupled instance for this gate, I_5_2 itself consists of a coupled group. Then, repeater solutions for its output net N_5_2 are computed, solutions to its input pins are propagated, and the gate is sized to achieve the best cost as defined in Equation 3. With a fixed size of I_5_2, timing violations for I_5_1 and I_5_3 are recalculated. The one with worst timing violation is selected, and it is processed in the same manner as the previous two gates. The rest of the gates and nets are processed following the flow defined in FIG. 2.

One thing to note here is that when a flop is sized up, there is a need to re-propagate solutions from output to clock pins. The impact of up-sizing on timing on the input side also needs to be recomputed, like any other gate. The worst violation, again, is the worst of violations at the clock pin and at the output of the gate at the preceding level. For a flop, the solutions at the output need to be propagated to the clock pin. Whether a flop is a most critical gate or not depends on violations at the output of the flop as well as the violation at the input of the flop.

IV. CONCURRENT GATE SIZING AND REPEATER INSERTION EXTENSION

Memory and Runtime Reduction

Fast Gate Size Search

The number of gate size choices is large in modern high-performance circuit designs. For example, there could be 20 different driving strength choices for inverters in the advanced 20 nm CMOS technology. Considering the large number of gates in the microprocessor design, the cost of evaluating each gate size could be prohibitive. As a result, a coarse-fine search strategy is proposed to speed up the optimization.

The first step is to search using coarse gate size steps. As noted in the algorithm "size and solution," the initial sizes of unvisited gates within coupled window (W) are set to the lowest slew-feasible sizes. Based on different gate types and the initial gate size, the number of possible gate sizes is calculated. If the gate size steps are large (e.g., 20), it is possible to skip some intermediate gate sizes when performing line 4 of the algorithm. For example, if the current gate size for an inverter is 2× and the closest feasible gate sizes are 3×, 4×, 6×, 8×, 12×, it is possible to skip gate sizes close to the current size (e.g., 3×, 4× and 6×). If a 4 step coarse search is used, the next gate size to check is 8× in the example.

The coarse gate size search will inevitably skip some optimal solutions. In order to overcome this, a fine search is used after a coarse search. In line 7 of the algorithm, if the new gate size with the coarse search does not generate better cost, the previous coarse size can be re-selected (to obtain a better cost), and then a fine search enabled. As the example in the previous paragraph, if a gate size of 8× yields worse total cost, the gate searching will be restored to 2×→3×→4×→6×. By combining the coarse search and fine search in the gate size optimization, run time is reduced without sacrificing optimality.

Incremental Cost Updating

In line 5 of the algorithm "size and solution," the cost function of circuit timing, gate sizes and repeater costs are updated when each new size is evaluated. There could be many coupled gates, and each gate may have multiple nets connected to the gate's output pins. As such, calculating the cost function in Equation (3) would be costly. To reduce this computation cost, it is possible to only calculate the timing violations for the ones that change. For example in FIG. 6, if G1 is under sized, the timing violations vio1 and vio2 only need to be updated. The timing of the other nodes remains the same.

Further run time reduction can be achieved by re-using the R/C trees of the nets which need to be updated. For example, vio1 depends on the two sinks, $in_2$ of G3 and $in_1$ of G1. Since only G1 is sized (which means the capacitance loading is changed) and G3 remains the same size, it is possible to only update the R/C networks connected to G1. Also notice that the timing of G1's input pins are changed, so the timing needs to be propagated again to update the timing violation vio1.

Other Optimization Techniques

Three techniques are proposed to reduce run time and improve solution quality in terms of fewer repeaters and more uniformity of repeater solutions for nets (or bits) within the same bus.

Slew Relaxation

In many cases, repeaters are inserted for nets to meet slew requirements even though these nets may not be timing critical. The slew constraints are set to maintain signal integrity for long interconnections. In many cases, however, a slight violation (e.g. 1 ps) of the predetermined maximum allowable slew value may cause an extra repeater to be inserted, which could lead to timing degradation and additional repeater cost. Here, the slew constraints are set more flexible to trade slew violation with timing gain. If a repeater solution has some small slew violation which is within the maximum slew violation limit, a modified slack of that solution is calculated with slew violation multiplied by a coefficient, p, as shown in Equation (4):

$$RAT_i'=RAT_i-p\text{slewvio}_i \text{ if}(\text{slewvio}_i<\text{maxslewvio}) \quad (4)$$

During solution generation and propagation, solutions with slight slew violations (within maxslewvio) will not be pruned out, but their timing will be penalized by pslewvio. This modified timing is used for pruning solutions. In this way, the slew requirement is relaxed to achieve repeater cost reduction and timing benefit.

Repeater Solutions in Bus Bits

The benefit of slew relaxation can also be observed for the nets within same bus bits. Consider a bus with multiple bits (e.g., 64 bits). The individual nets within that bus are similar but all have some small variations due to different routing shapes and coupling capacitances with different nearby nets. It is not uncommon to find some nets within the same bus bits needing one more repeater to meet the slew requirements. Slew relaxation can help solve the problem of uneven repeater numbers for nets within the same bus bits, since some nets may insert one extra repeater for fixing a picosecond slew violation. By applying slew relation, it is more likely that similar repeater solutions in bus bits can be achieved.

Another approach to achieve more uniform repeater solutions for nets in bus bits is to generate more possible repeater locations. In one implemented repeater insertion program for example, the possible repeater locations are predetermined using wire resistance and capacitance calculation. Using more possible repeater locations could help the solution quality but requires more run time. Denser repeater locations are used for nets in bus bits, so the optimal locations will be less likely to be skipped for these nets. By combining the slew relaxation and denser repeater locations, it is possible to obtain more uniform repeater solutions in the nets of a bus, as will be shown in the experimental results below.

Repeater Count Reduction

In today's complex microprocessor or ASIC designs, routing congestion is becoming a more and more challenging problem. The insertion of repeaters requires extra vias and routing metals, which places demands on routing resources. In order to alleviate the impact of routing congestions, one possible solution is to use larger repeaters to replace smaller repeaters so that the number of required repeaters can be reduced.

Several methods are proposed to reduce repeater counts. One method reduces the cost difference of smaller repeater and larger repeater types so during solution generation and pruning, the solutions with larger repeaters will be less likely than before to be pruned out. Experiments show that when a solution with larger repeaters could meet the slew requirements, it is more likely to have better timing than solutions with more smaller repeaters, so the repeater insertion program would choose that solution with larger and fewer repeaters.

Another method uses repeater count as an extra pruning criteria during solution generation and pruning. If a slew-feasible repeater solution has fewer repeaters than other solutions, it will be kept and propagated to the upper levels. When the solutions are propagated to the drivers, the repeater count is factored into the cost function, so the repeater cost in Equation (2) will be changed by adding the weighted repeater count cost:

$$\text{repCost}=a\text{repCount}+b\text{repArea} \quad (5)$$

By modifying the weighting coefficient for the repeater count cost, it is also possible to perform the trade off between timing and repeater cost in Equation (3).

V. EXPERIMENT RESULTS

Concurrent Gate Sizing and Repeater Insertion

By using concurrent gate sizing and repeater insertion, a significant repeater number reduction, timing improvement and power reduction for various designs in different technology generations has been observed:

TABLE 1

Comparison of Repeater and Timing Statistics (1$^{st}$ example design)

|  | Repeater Insertion Only | Concurrent Gate Sizing and Repeater Insertion |
|---|---|---|
| Repeater Count | 21224 | 16596 (−21.8%) |
| Repeater | 25x: 8211 | 25x: 4358 |

TABLE 1-continued

Comparison of Repeater and Timing Statistics (1st example design)

| | Repeater Insertion Only | Concurrent Gate Sizing and Repeater Insertion |
|---|---|---|
| Distribution | 46x: 10102<br>58x: 1905<br>72x: 982<br>87x: 24<br>Area: 65639 | 46x: 6180<br>58x: 3244<br>72x: 2456<br>87x: 358<br>Area: 59134 (−9.2%) |
| Sizes: Gate | | Sized Up #: 19851<br>Sized Down #: 14938<br>Area change: +2685 |
| Repeater + Gate | | −5.8% |
| Run Time | 21224 s | 27420 s |
| Vio Path (#) | 699053 | 697640 |
| Worst Slack | −0.7833 ns | −0.7382 ns |
| Slew Violating Nets (#) | 18954 | 15209 |

TABLE 2

Comparison of Repeater and Timing Statistics (2nd example design)

| | Repeater Insertion Only | Concurrent Gate Sizing and Repeater Insertion |
|---|---|---|
| Repeater Inserted (#) | 38142 | 28910 (−24.2%) |
| Gate Up/Down (#) | | Up: 8972, Down: 13574 |
| Worst Slack | −0.5565 ns | −0.5215 ns |
| Total Negative Slack | −406.9358 ns | −346.7647 ns |
| Run Time | | 43244.3 s |

TABLE 3

Comparison of Repeater and Timing Statistics (3rd example design)

| | Repeater Insertion Only | Concurrent Gate Sizing and Repeater Insertion |
|---|---|---|
| Repeater Inserted (#) | 36154 | 27777 (−23.2%) |
| Repeater Area | 301660 | 176825.114 |
| Gate Up/Down (#) | | Up: 1827, Down: 4866 |
| Gate Area Change | | Before: 19933.9, After: 15495.6 |
| Worst Slack | −0.0708 ns | −0.0756 ns |
| Total Negative Slack | −25.9463 ns | −37.9790 ns |

TABLE 4

Comparison of Repeater and Timing Statistics (4th example design)

| | Repeater Insertion Only | Concurrent Gate Sizing and Repeater Insertion |
|---|---|---|
| Repeater Inserted (#) | 1375 | 807 (−41.3%) |
| Gate Up/Down (#) | | Up: 2535, Down: 541 |
| Worst Stack | −0.0856 ns | −0.0785 ns |
| Total Negative Slack | −10.5774 ns | −4.8535 ns |

TABLE 5

Comparison of Repeater and Timing Statistics (5th example design)

| | Repeater Insertion Only | Concurrent Gate Sizing and Repeater Insertion |
|---|---|---|
| Repeater Insertion (#) | 3263 | 2518 (−22.83%) |
| Gate Up/Down (#) | | Up: 394, Down: 745 |
| Total Negative Slack | −36.3074 ns | −34.0255 ns |

Slew Relaxation

When the slew is relaxed, the number of required repeaters to fix the slew requirements will reduce. In one example, it has been observed that there is a 600 repeater reduction per 1 ps maxSlew relaxation.

Bus Bit Repeater Solution Fixing

As discussed above, more uniform repeater solutions can be achieved by relaxing the slew requirement and by adding more possible repeater locations. One example for a bus is shown below:

TABLE 6

Impact of Slew Relaxation to Make Bus Bit Repeater Solutions Uniform

| | 1 Repeater Net | 2 Repeater Nets |
|---|---|---|
| No Slew Relaxation | 21 | 29 |
| 3 ps Slew Relaxation | 41 | 9 |
| 3 ps Slew Relaxation and More Repeater Locations | 50 | 0 |

As apparent from the table above, by combining slew relaxation and increasing the number of possible repeater locations, uniform repeater counts for all bus bits can be achieved.

Repeater Count Reduction

By considering repeater count in the cost determination, the repeater number can be reduced. For an example design, repeater insertion in timing optimal mode results are listed below:

TABLE 7

Comparison of Repeater Count and Timing

| | Reference (timing optimum mode) | With Repeater Reduction |
|---|---|---|
| Repeater Number | 57572 | 52594 (−8.6%) |
| Repeater Type Distribution | 19x: 13782<br>37x: 21612<br>58x: 22178 | 19x: 11319<br>37x: 19328<br>58x: 21947 |
| Worst Slack | −0.3785 ns | −0.3605 ns |
| Total Negative Slack | −812.39 ns | −820.94 ns |

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A method for circuit concurrent gate sizing and repeater insertion comprising:
by at least one processor
assigning each gate of a circuit containing multiple paths into one of a plurality of levels based on logical connections of the gates excluding repeaters such that each of the levels encompasses more than one of the paths, and
for each of the levels,
identifying coupled gates associated with a minimum slack gate that is shared by more than one of the paths based on an adjacency gate parameter, wherein the minimum slack gate is contained by a minimum slack path of the more than one of the paths and the coupled gates are contained by non-minimum slack paths of the more than one of the paths,
generating repeater insertion solutions at each output of the coupled gates,
assigning to each of the coupled gates a minimum size based on a maximum slew limit,
propagating the repeater insertion solutions at each of the outputs to corresponding inputs,
selecting, for each of the outputs of the minimum slack gate, a minimum cost repeater insertion solution from the repeater insertion solutions,
increasing a size of the minimum slack gate, and
selecting, for each of the outputs of the increased size minimum slack gate, an updated minimum cost repeater insertion solution from the repeater insertion solutions; and
physically implementing the increased size minimum slack gate in the circuit.

2. The method of claim 1 further comprising relaxing the maximum slew limit to decrease timing slack violations, repeater area, or repeater power associated with the repeater insertion solutions.

3. The method of claim 1 further comprising iteratively performing the operations of increasing a size of the minimum slack gate and selecting an updated minimum cost repeater insertion solution until accepting or rejecting the size of the minimum slack gate based on the updated minimum cost repeater insertion solutions.

4. The method of claim 1, wherein the size of the minimum slack gate is increased to a next available size.

5. The method of claim 1, wherein the size of the minimum slack gate is increased to a size greater than a next available size.

6. The method of claim 1, wherein the size of the minimum slack gate is increased to a size less than a maximum size limit.

7. The method of claim 1, wherein the circuit includes a bus, further comprising relaxing the maximum slew limit such that repeater counts for all driving gates of the bus are the same.

8. The method of claim 1 further comprising estimating timing slack and arrival times of the circuit.

9. The method of claim 8 further comprising updating the timing slack based on the repeater insertion solutions.

10. The method of claim 1, wherein the minimum cost repeater insertion solutions are based on timing violations at inputs corresponding to the outputs.

11. The method of claim 10, wherein, if the minimum slack gate is a flop, the minimum cost repeater insertion solutions are based on a maximum of the timing violations at outputs and inputs of the flop.

12. A system for circuit concurrent gate sizing and repeater insertion comprising:
at least one processor programmed to, for coupled gates within a level of a levelized circuit falling within a coupling window defined by a minimum slack gate that is shared by more than one path encompassed by the level and adjacent gates coupled to the minimum slack gate with an adjacency parameter less than a predefined adjacency limit, wherein the minimum slack gate is contained by a minimum slack path of the more than one path and the coupled gates are contained by non-minimum slack paths encompassed by the level,
a) assign to each of the coupled gates a minimum size based on a maximum slew limit,
b) propagate repeater insertion solutions at each output of the coupled gates to corresponding inputs,
c) select, for each of the outputs of the minimum slack gate, a minimum cost repeater insertion solution from the repeater insertion solutions,
d) increase a size of the minimum slack gate,
e) select, for each of the outputs of the increased size minimum slack gate, an updated minimum cost repeater insertion solution from the repeater insertion solutions,
f) iteratively perform d) and e) until accepting or rejecting the size based on the updated minimum cost repeater insertion solutions, and
g) implement the increased size minimum slack gate in the circuit.

13. The system of claim 12, wherein the at least one processor is further configured to relax the maximum slew limit to decrease timing slack violations, repeater area, or repeater power associated with the repeater insertion solutions.

14. The system of claim 12, wherein the at least one processor is further configured to relax the maximum slew limit such that repeater counts for all driving gates of a bus of the circuit are the same.

15. The system of claim 12, wherein the minimum cost repeater insertion solutions are based on timing violations at inputs corresponding to the outputs.

16. The system of claim 15, wherein, if the minimum slack gate is a flop, the minimum cost repeater insertion solutions are based on a maximum of the timing violations at outputs and inputs of the flop.

17. A non-transitory computer readable medium having instructions stored thereon that, when executed by a processor, cause the processor to perform operations of, for coupled gates within a level of a levelized circuit falling within a coupling window defined by a minimum slack gate that is shared by more than one path encompassed by the level and adjacent gates coupled to the minimum slack gate with an adjacency parameter less than a predefined adjacency limit, wherein the minimum slack gate is contained by a minimum slack path of the more than one path and the coupled gates are contained by non-minimum slack paths encompassed by the level, assigning to each of the coupled gates a minimum size based on a maximum slew limit, propagating repeater insertion solutions at each output of the coupled gates to corresponding inputs, selecting, for each of the outputs of the minimum slack gate, a minimum cost repeater insertion solution from the repeater insertion solutions, increasing a size of the minimum slack gate, selecting, for each of the outputs of the increased size minimum slack gate, an updated minimum cost repeater insertion solution from the repeater insertion solutions, and implementing the increased size minimum slack gate in the circuit.

18. The medium of claim 17, wherein the instructions, when executed, further cause the processor to perform an operation of relaxing the maximum slew limit to decrease timing slack violations, repeater area, or repeater power associated with the repeater insertion solutions.

19. The medium of claim 17, wherein the instructions, when executed, further cause the processor to perform an operation of relaxing the maximum slew limit such that repeater counts for all driving gates of a bus of the circuit are the same.

20. The medium of claim 17, wherein the size of the minimum slack gate is increased to a size greater than a next available size.

* * * * *